Figure 1:
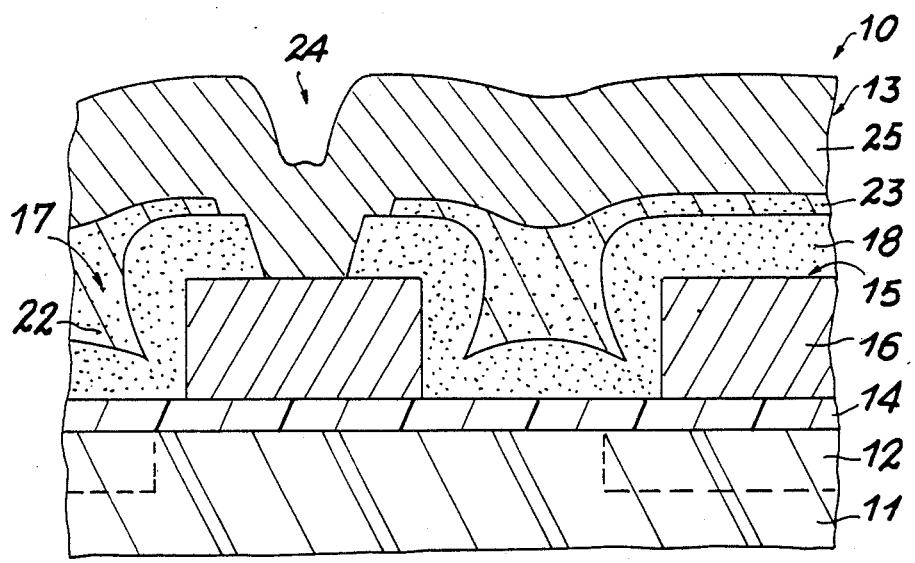

United States Patent [19]

Merenda et al.

[11] Patent Number: 4,906,592
[45] Date of Patent: Mar. 6, 1990

[54] METHOD FOR FORMING A MULTILAYERED METAL NETWORK FOR BONDING COMPONENTS OF A HIGH-DENSITY INTEGRATED CIRCUIT USING A SPIN ON GLASS LAYER

[75] Inventors: Pierre Merenda, Aix en Provence; Philippe Chantraine, Neuilly sur Seine; Daniel Lambert, Juvisy sur Orge, all of France

[73] Assignee: Bull S.A., Paris, France
[21] Appl. No.: 323,049
[22] Filed: Mar. 14, 1989

Related U.S. Application Data

[63] Continuation of Ser. No. 914,655, Dec. 31, 1986, abandoned.

[30] Foreign Application Priority Data

Oct. 3, 1985 [FR] France ............................... 85 14669

[51] Int. Cl.$^4$ ...................... H01L 21/00; H01L 21/02; B44C 1/22; C03C 15/00
[52] U.S. Cl. .................................. 437/190; 437/189; 437/194; 437/195; 437/231; 156/643; 427/51; 427/96
[58] Field of Search ............... 437/187, 189, 190, 194, 437/195, 231; 156/643, 653, 656; 427/51, 53.1, 96; 148/DIG. 1

[56] References Cited

U.S. PATENT DOCUMENTS

| | | |
|---|---|---|
| 3,506,880 | 4/1970 | Langdon et al. |
| 3,542,550 | 11/1970 | Conrad et al. |
| 4,222,792 | 9/1980 | Lever et al. ........................ 156/657 |
| 4,305,974 | 12/1981 | Abe et al. .......................... 437/190 |
| 4,349,609 | 9/1982 | Takeda et al. ..................... 437/189 |
| 4,436,582 | 3/1984 | Saxena ............................... 156/656 |
| 4,451,326 | 5/1984 | Gwozdz .............................. 29/591 |
| 4,481,070 | 11/1984 | Thomas et al. ..................... 156/643 |
| 4,519,872 | 5/1985 | Anderson, Jr. et al. ............ 156/643 |
| 4,523,372 | 6/1985 | Balda et al. ........................ 29/578 |
| 4,523,975 | 7/1985 | Groves et al. ...................... 156/643 |
| 4,541,169 | 9/1985 | Bartush .............................. 156/643 |
| 4,545,852 | 10/1985 | Barton ................................ 427/88 |
| 4,576,900 | 3/1986 | Chiang ................................ 427/96 |
| 4,604,641 | 8/1986 | Konishi .............................. 357/59 |
| 4,654,113 | 3/1987 | Tuchiya et al. ..................... 156/643 |
| 4,662,064 | 5/1987 | Hus et al. ........................... 156/643 |
| 4,674,176 | 6/1987 | Tuckerman ......................... 437/189 |
| 4,676,867 | 6/1987 | Elkins et al. ....................... 29/591 |
| 4,681,795 | 7/1987 | Tuckerman ......................... 427/53.1 |

FOREIGN PATENT DOCUMENTS

| | | | |
|---|---|---|---|
| 0025261 | 7/1980 | European Pat. Off. | |
| 0071010 | 6/1982 | European Pat. Off. | |
| 0147203 | 12/1984 | European Pat. Off. | |
| 0101292 | 8/1979 | Japan | 437/231 |
| 57-59359 | of 1982 | Japan | |
| 0170550 | 10/1982 | Japan | 437/231 |
| 58-19727 | of 1983 | Japan | |
| 0086746 | 5/1983 | Japan | 437/231 |
| 0066147 | 4/1984 | Japan | |
| 0180458 | 8/1986 | Japan | 437/231 |
| 0030335 | 2/1987 | Japan | 437/231 |

OTHER PUBLICATIONS

Kuisl, M., Silicon Dioxide Films Prepared by Spin-On Solutions, Thin Solid Films, 157 (1988) pp. 129–134.
Bui, M., Contact Glass Planarization Using a Double Etch Back Technique and Spin-On Glass Sacrificial Layer, IEEE, New York, U.S.A., pp. 484, 385–393, 1987.
Saia, R., Dry Etching of Tapered Contact Holes Using Multilayer Resist, J. Electrochem. Soc. Sol. State Sci. & Tech., 8/85, pp. 1954–1957.
"One-Step Etchback", IBM Disclosure Bulletin, vol. 29, No. 11, Apr. 1987, pp. 4890–4892.

Primary Examiner—Brian E. Hearn
Assistant Examiner—B. Everhart
Attorney, Agent, or Firm—Kerkam, Stowell, Kondracki & Clarke

[57] ABSTRACT

In a high-density integrated circuit having a multilayered metal interconnection network, a planarization layer is formed over a lower metal layer which includes conductors having steep edges by chemically depositing a dielectric layer in the vapor phase over the lower metal layer so as to fill up hollows formed in the dielectric layer in intervals between the conductors, spreading a viscous layer of spin-on-glass over the dielectric layer, annealing the spin-on-glass layer to form a compact mass, forming vias through the spin-on-glass and dielectric layers to the conductors, and applying an upper metal layer over the spin-on-glass layer so as to fill the vias and provide electrical contacts to the conductors of the lower metal layer.

12 Claims, 2 Drawing Sheets

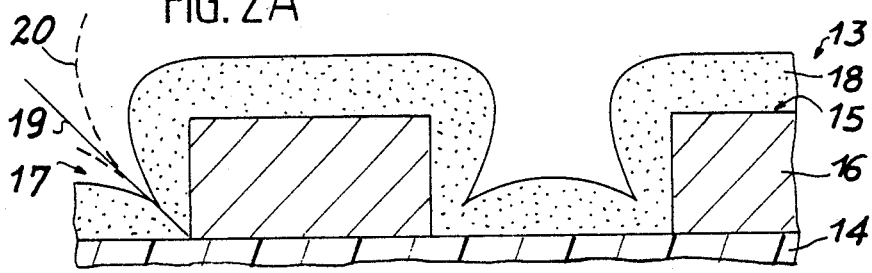
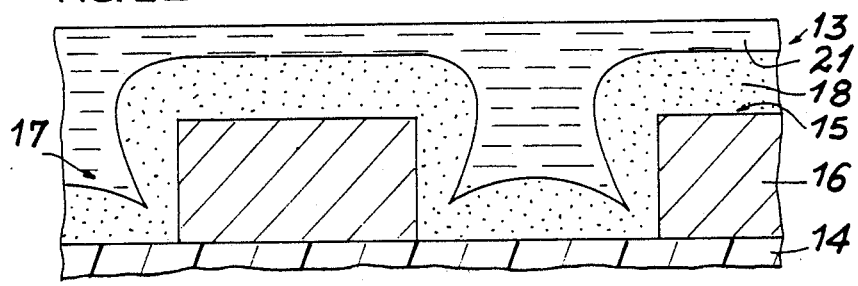
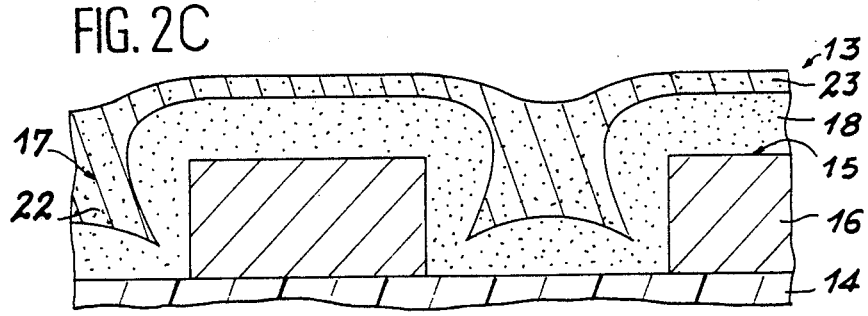
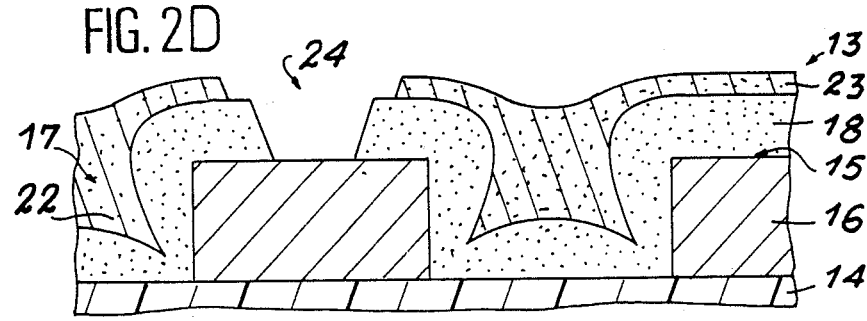

METHOD FOR FORMING A MULTILAYERED METAL NETWORK FOR BONDING COMPONENTS OF A HIGH-DENSITY INTEGRATED CIRCUIT USING A SPIN ON GLASS LAYER

This is a continuation of application Ser. No. 914,655, filed Oct. 2, 1986 abandoned.

The invention relates to a method for forming a multilayered metal network for bonding components of a high-density integrated circuit, as well as an integrated circuit produced thereby, which is currently known as a VLSI chip (for very large scale integration).

Conventional methods for forming a multilayered network for bonding components of a chip substantially comprise forming a metal film on a dielectric layer that covers a lower metal layer comprising conductors. At the present time, the conductive layers are ordinarily of aluminum and have a thickness in the micrometer range.

Initially, the thickness of the lower metal layer is uniform and covers a base surface that extends above the components of the chip. The conductors are ordinarily etched, by placing the lower metal layer in reactive plasma. This etching is practically anisotropic. It is done in the direction of the thickness of the layer and thus imparts an approximately rectangular section to the conductors. At present, the typical spacing of the metal conductors is 6 micrometers (6 μm), for a width of 3 μm, and a reduction of these dimensions is desirable.

The etched layer is then covered with a dielectric layer, which is ordinarily produced by chemical deposition of silicon dioxide ($SiO_2$) in the vapor phase. Typically, this layer has a thickness on the order of 0.8 μm. It is desirable for the dielectric layer to have a uniform thickness over the entire lower metal layer, so as to assure satisfactory and uniform electrical insulation between the two metal layers.

Next, contact openings are made (called vias) through the dielectric layer for bonding between the conductors and the upper metal layer. This upper metal layer is disposed on the dielectric layer and in its openings, and is then etched so as to form conductors, in a manner analogous to that for the lower layer.

At present, this technique presents serious problems, which are prejudicial to the desired density of the bonding network and are substantially caused by the abrupt front edges of the conductors of the lower layer. Instead of obtaining a dielectric layer of uniform thickness, experience has shown that the dielectric shrinks in the angles formed by the conductors with their base surface in a plane perpendicular to the conductors. More specifically, the thickness of the dielectric layer decreases progressively toward the top of each base angle, at a tangent to a straight line that approximately corresponds to the bisector of the angle and will hereinafter be called the bisector, for convenience. Of itself, this layer already has the disadvantage that in the base angles it provides defective insulation between the metal layers.

In practice, the major problem is presented by the deposition of the upper conductive layer on the dielectric layer, since as will be appreciated the defects in the covering provided by the dielectric layer are amplified considerably thereby. In fact, experience has shown that there is a very pronounced thinning of the conductive layer, at a tangent to the bisector of the base angles. The metal layer, viewed in each base angle and in a plane that is normal to the conductors, takes the form of two adjacent lips, which are at a tangent to the plane bisecting the base angle. The thinning that prevails at the junction of the lips creates an undesirable electrical resistance, which the layer accumulates in all of its base angles.

This disadvantage is made still worse if the base surface of the conductors is not flat and if it covers bulges that are approximately right angles. This is the case, for example, if the lower conductive layer is metal and covers another conductive layer that is of polycrystalline silicon or of metal. In that case, two conductors can be superimposed and can create a more accentuated undulation, which is reflected in a more extended and more accentuated thinning of the conductive layer along vertical walls, and consequently in a defective electrical connection with the adjoining portion of the base. In all cases, the conductors of the upper layer will accordingly have an appreciable succession of resistances in all its base angles and so will be of questionable reliability.

The solution presently used for overcoming this serious disadvantage has been to provide conductive micrograins between the lips of the upper conductive layer in each base angle. Nevertheless, it is clear that the efficacy of these micrograins is often inadequate. Furthermore, even if they do prove adequate, the undulation of the lower layer presents another problem in terms of the etching of the upper conductive layer. This etching is again preferably done in reactive plasma, its duration determined by the thickness of the layer that is to be etched. Since the etching in reactive plasma is anisotropic and is normally done in the general plane of the chip, the duration of the etching is determined by the thickness of the conductive layer along this direction. At the steep edges, it is found that the thickness of the conductive layer along this direction may attain twice the value of the thickness in other portions of the layer, which determine the etching time. Thus the etching must be performed until conductive portions on the steep edges of the dielectric layer are completely removed, so as to assure perfect electrical insulation between adjacent conductors. However, extending the duration of the etching substantially affects the quality.

Furthermore, the shape of the lip that forms on the dielectric layer on the abrupt edges of the lower conductive layer presents a particularly important, and practically insoluble, problem in terms of etching the upper conductive layer. In fact, the apex of the lip on the dielectric layer casts a shadow in the reactive plasma and so screens the metal portion located in that zone. Etching proves to be imperfect, leaving residual conductive portions, with adverse and often intolerable consequences (such as the risk of short-circuiting, etc.).

The invention overcomes all these problems by making the support surface for the upper metal layer approximately planar.

The method according to the invention for forming a multilayered metal network for bonding the components of a high-density integrated circuit, comprising forming a lower metal layer including conductors having steep edges, chemically depositing a dielectric layer in the vapor phase onto the lower metal layer, making openings in the dielectric layer above the conductors, and covering the dielectric layer with an upper metal layer, is characterized in that it comprises approximately filling up the hollows formed by the dielectric layer in the intervals between the conductors, spreading a viscous dielectric suspension and proceeding to anneal the suspension, and further penetrating the layer obtained by annealing, so as to make the openings.

The invention also relates to the high-density integrated circuit produced by this method.

The characteristics and advantages of the invention will become apparent from the ensuing description, which is provided by way of non-limiting example, taken in conjunction with the accompanying drawings.

In the drawings:

FIG. 1 is a fragmentary cross-sectional view of a high-density integrated circuit according to the invention; and FIGS. 2A-2D are views analogous to those of FIG. 1, illustrating the essential steps of the method according to the invention for obtaining the integrated circuit shown in FIG. 1.

The high-density integrated circuit 10 shown in FIG. 1 comprises a semiconductor substrate 11 that incorporates a set of components 12 shown in schematic form, and a metal network 13 for bonding the components 12 of the substrate 11. The network 13 generally has as its base surface the upper surface of an insulating layer 14 that covers the substrate 11. However, in MOS (metal oxide semiconductor) technology, the metal layer 13 often covers a primary layer of bonding conductors made of polycrystalline silicon. Since polycrystalline conductors do not present the problems the invention is intended to overcome, these conductors are not shown in FIG. 1, but it will be understood that an integrated circuit according to the invention may include such conductors. The bonding network 13 of the integrated circuit 10 shown in FIG. 1 will now be described, in terms of the method for manufacturing it that is shown in FIGS. 2A-2D.

Referring to FIGS. 1 and 2A, the bonding network 13 first, in the standard manner, includes a lower conductive layer 15 that covers the upper surface of the insulating layer 14. The layer 15 comprises metal conductors 16 separated by intervals 17. The conductors 16 are generally parallel to one another, in the direction perpendicular to the plane of the drawings, and have a substantially rectangular section. This section is due to the etching, in reactive plasma, of a first metal layer that uniformly covers the insulating layer 14. Certain variants of this etching make it possible to obtain edges that are less steep, but they nevertheless present the same problems as those associated with vertical faces. The expression "conductors having steep edges" must accordingly be understood as including all conductors in which the slope of their edges present the same problems as those discussed above and illustrated hereinafter.

Also in the standard manner, a dielectric layer 18 is deposited over the entire lower layer 15. It is ordinarily made of mineral silicon dioxide, chemically deposited in the vapor phase. Experience has shown that shrinkage of the dielectric layer 18 occurs in the base angles of the layer 15, that is, the angles that the conductors 16 form with the insulating layer 14. As illustrated, this shrinkage lends the layer a lip-shaped profile, which in the plane of the drawings converges at a tangent to a straight line 19 that corresponds approximately to the bisector of each angle. This phenomenon is due to the steep edges of the conductors and occurs regardless of the manner in which the layer 18 is deposited.

The sequence of the standard method was to deposit a metal film over the dielectric layer 18. In this case, the profile of this layer in the base angles will be that represented with dot line, 20 in FIG. 2A. As shown, the shrinkage of such a layer is notably more pronounced than that of the layer 18. The method according to the invention overcomes this disadvantage.

Generally, the invention comprises at least partially filling up the hollows that exist in the intervals 17 between the conductors 16, such as to provide the upper metal layer with a roughly planar base surface. To achieve this, a viscous dielectric suspension 21 is deposited on the integrated circuit 10, then spread uniformly over the entire surface of the dielectric layer 18. In FIG. 2B, the suspension 21 has been provided in a quantity sufficient to overflow the hollows formed by the dielectric layer 18 in the intervals 17. The spreading is preferably obtained by causing the semiconductor wafer, including the integrated circuit 10, to rotate at a speed determined in such a manner that the centrifugal force comes to balance the forces of viscosity of the suspension. For example, the suspension may be a mineral-silica-based gel, advantageously in colloidal form, such as that presently known as S.O.G. (spin-on glass) and well known in the art. In this case, the viscous dielectric suspension is used in the same manner as the photosensitive resins used for the configuration of the elements of the integrated circuit. Now proceeding to anneal the suspension 21, the solvent of the suspension evaporates while the dielectric forms a compact mass 22, such as that shown in FIG. 2C. The mass 22 is substantially localized in the intervals 17, but in the form of a thin film 23 it also covers the dielectric layer 18 located above the conductors 16. It should be noted that the films 23 will always be present, no matter what the degree of filling of the hollows in the intervals 17, because of the viscosity of the suspension 21 and its spreading. In FIG. 2D, the contact openings 24 are made above the conductors 16 to bond them to the upper metal layer that will be deposited later. The openings 24 are also typically etched in reactive plasma. The normal etching would thus create steep edges, similar to those of the conductors 16, and would result in the same phenomenon of shrinkage of the upper layer in the base angles of the openings 24. To avoid this shrinkage, a standard variant etching method is used, which flares the openings and thus makes the base angles markedly obtuse. The angle of the flaring depends particularly on the properties of the etched material. As a consequence, because of the difference in structure of the dielectrics of the mass 21 and of the layer 18, the formation of each opening 24 creates a profile comprising two coaxial frustoconical portions, relative to the film 23 and to the layer 18, the portion relative to the film 23 being flared to a greater degree. It should be noted that this variant etching method in reactive plasma is not used for making the conductors 16, because that would considerably reduce their cross section and would preclude the development of the very high densities in the bonding network 13 that are sought.

The deposition of the upper metal layer 25 results in the configuration shown in FIG. 1. Naturally the layer 25 may later serve as a lower layer, so that the method according to the invention can also be used for forming a network 13 for bonding three metal layers as well.

We claim:

1. A method of forming a multilayered metal network for interconnecting components of a high-density integrated circuit, comprising forming on a substrate a lower metal layer comprising conductors having steep edges; applying a dielectric directly over said lower metal layer so that the conductors are covered by areas of the dielectric layer; applying a layer of a mineral spin-on-glass directly over said dielectric layer so as to form a thin film covering of spin-on-glass over said areas; controlling a reactive plasma for etching portions of said thin film of said spin-on-glass layer and the areas of said dielectric layer underlying the spin-on-glass layer to form flared vias which expose portions of the conductors of said lower metal layer; and applying an upper metal layer directly onto said spin-on-glass layer so as to cover said spin-on-glass layer and fill said vias.

2. The method of claim 1, wherein said etching comprises etching the spin-on-glass and dielectric layers using reactive plasma etching.

3. The method of claim 1, wherein said etching comprises controlling the etching to flare the vias and provide the vias with obtuse base angles.

4. The method of claim 1, wherein said applying the dielectric layer comprises applying the dielectric layer using chemical vapor deposition of silicon dioxide.

5. A method of forming a multilayered metal network for interconnecting components of a high-density integrated circuit, comprising forming on a substrate a lower metal layer including conductors having steep edges; applying a dielectric layer directly over said lower metal layer using chemical vapor deposition of silicon dioxide; spreading a layer of spin-on-glass in the form of a viscous suspension of silicon dioxide directly onto said lower metal layer; annealing the spin-on-glass suspension layer; forming vias through said spin-on-glass and dielectric layers to expose portions of said conductors of said lower metal layer by using a reactive plasma etching process which is controlled to flare the vias and provide the vias with a frusto-conical section; and applying directly over said spin-on-glass layer as upper metal layer, the upper metal layer being applied so as to cover the spin-on-glass layer and to fill the vias.

6. The method of claim 1, wherein the spin-on-glass is applied as a mineral silica-based gel in colloidal form.

7. The method of claim 6, wherein said etching comprises controlling the etching to flair the vias and provide the vias with obtuse base angles.

8. The method of claim 2, wherein said etching comprises controlling the etching to flair the vias and provide the vias with obtuse base angles.

9. The method of claim 6, wherein said applying the dielectric layer comprises applying the dielectric layer using chemical vapor deposition of silicon dioxide.

10. The method of claim 2, wherein said applying the dielectric layer comprises applying the dielectric layer using chemical vapor deposition of silicon dioxide.

11. The method of claim 3, wherein said applying the dielectric layer comprises applying the dielectric layer using chemical vapor deposition of silicon dioxide.

12. The method of claim 5, wherein said spreading comprises applying the spin-on-glass in colloidal form.

* * * * *

UNITED STATES PATENT AND TRADEMARK OFFICE
CERTIFICATE OF CORRECTION

PATENT NO. : 4,906,592

DATED : March 6, 1990

INVENTOR(S) : Merenda et al

It is certified that error appears in the above-identified patent and that said Letters Patent is hereby corrected as shown below:

On the title page:

Under "Related U.S. Application Data", the filing date for Continuation of Serial No. 914,655, "Dec. 31, 1986" should read --October 2, 1986--.

Signed and Sealed this

Nineteenth Day of November, 1991

Attest:

HARRY F. MANBECK, JR.

*Attesting Officer*  *Commissioner of Patents and Trademarks*